United States Patent [19]

Hagino et al.

[11] Patent Number: 4,851,718
[45] Date of Patent: Jul. 25, 1989

[54] ACTIVE FILTER TYPE SIGNAL ADJUSTING CIRCUIT

[75] Inventors: Hideyuki Hagino, Fukaya; Takahiro Kusano, Kumagaya, both of Japan

[73] Assignee: Kabushiki Kaisha Toshiba, Kawasaki, Japan

[21] Appl. No.: 239,656

[22] Filed: Sep. 2, 1988

[30] Foreign Application Priority Data

Sep. 8, 1987 [JP]  Japan .................... 62-224508

[51] Int. Cl.$^4$ ............ H03B 1/00; H03K 5/00
[52] U.S. Cl. .................... 307/520; 307/529; 328/167; 328/169
[58] Field of Search .......... 307/520, 521, 271, 529; 328/167, 169; 333/14; 330/104, 107, 279

[56] References Cited

U.S. PATENT DOCUMENTS 3,978,409  8/1976  Dolby et al. .......... 328/169
4,063,450  12/1977  Lyons ................ 328/167

Primary Examiner—Stanley D. Miller
Assistant Examiner—Timothy P. Callahan
Attorney, Agent, or Firm—Cushman, Darby & Cushman

[57] ABSTRACT

A first operational amplifier differentially operates a signal to be adjusted input by an input unit and an adjusted signal output by an output unit. A second operational amplifier differentially operates a first output from the first operational amplifier and the adjusted signal. A buffer supplies a second output from the second operational amplifier to the output unit as the adjusted signal. A first adder obtains a sum component of a first signal obtained by multiplying a first variable m with the signal to be adjusted and a second signal obtained by multiplying a second variable 1−n with the adjusted signal. A first capacitor superposes the sum component of the first and second signals on the first output to supply a superposed signal to the second operational amplifier. A second adder obtains the signal to be adjusted or a component obtained by multiplying the first variable m with the signal to be adjusted as a third signal. A second capacitor superposes the third signal on the second output to supply a superposed signal to the buffer. The first and second variables m and 1−n are selected as desirable values in an adjusting mode and are respectively set to be m=n=1 (where 0≦n and m≦1) in a non-adjusting mode.

11 Claims, 4 Drawing Sheets

① $gm_3 > \frac{1}{2} gm_2$

② $gm_3 = \frac{1}{2} gm_2$

③ $0 \leq gm_3 < \frac{1}{2} gm_2$

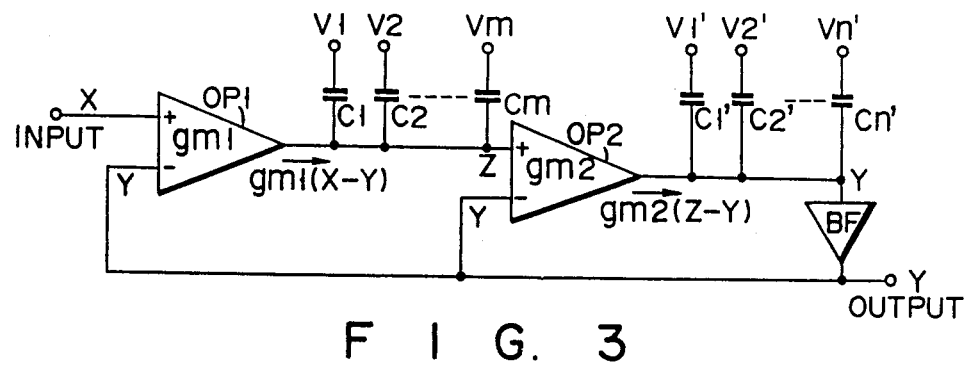
F I G. 3
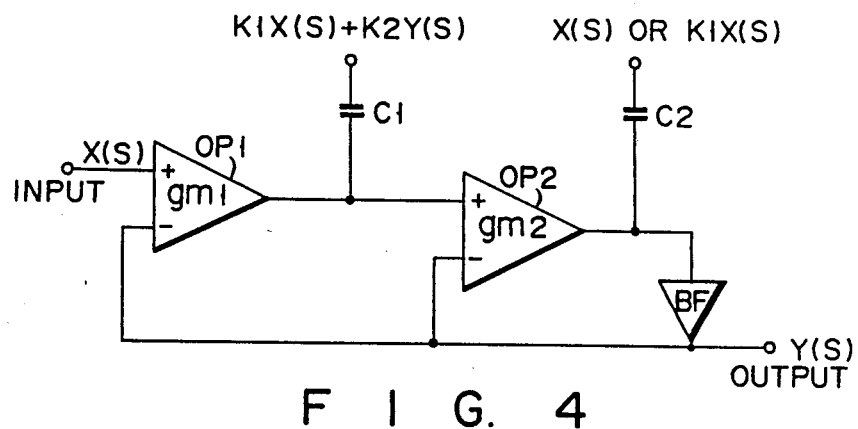
F I G. 4
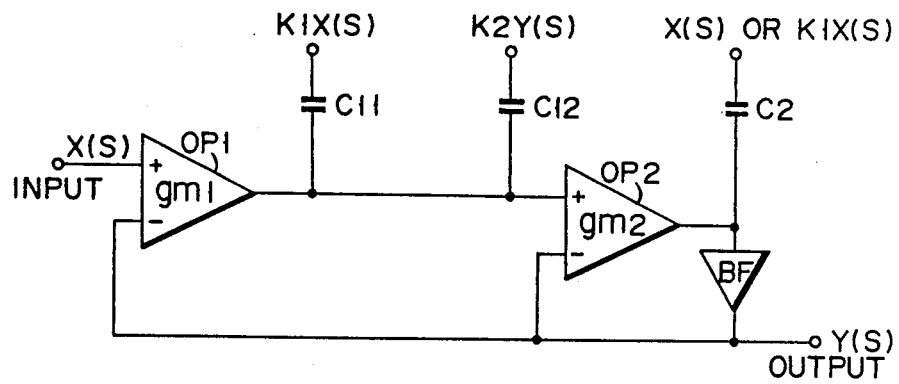
F I G. 5

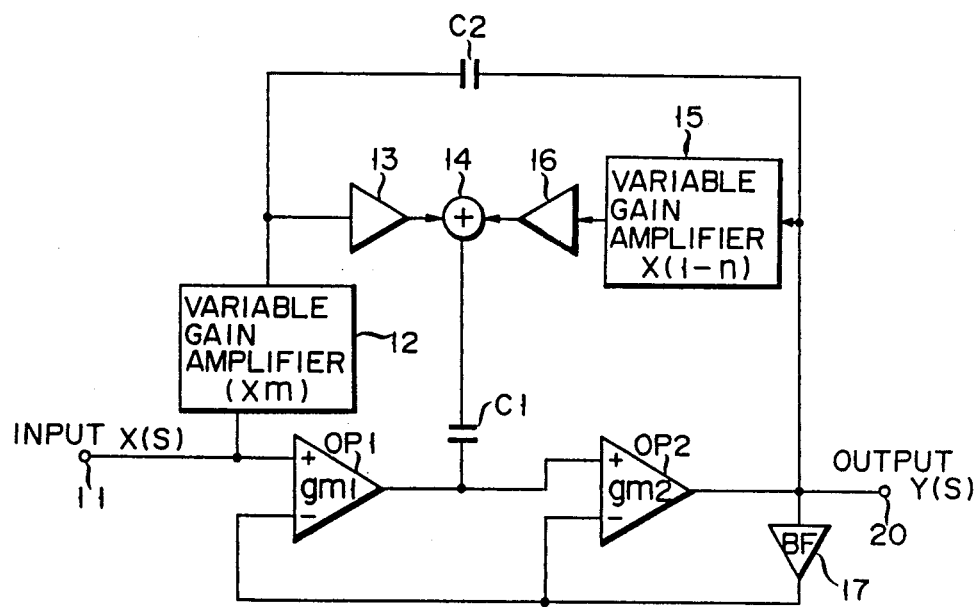
F I G. 6
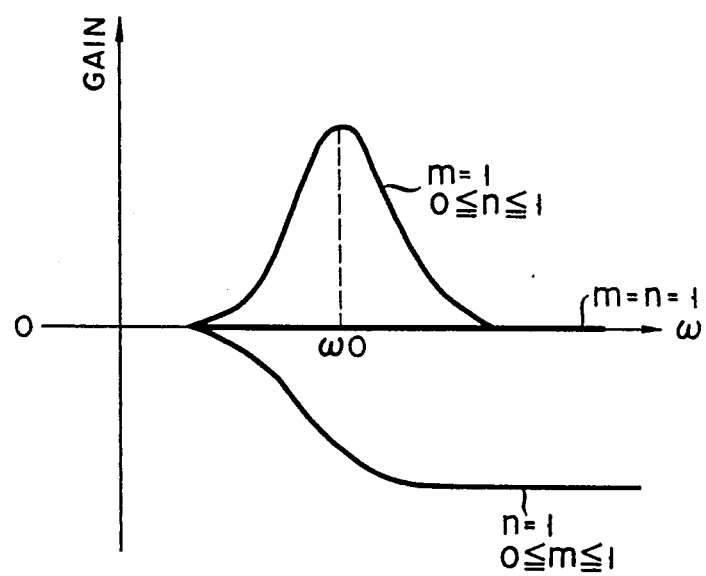
F I G. 7

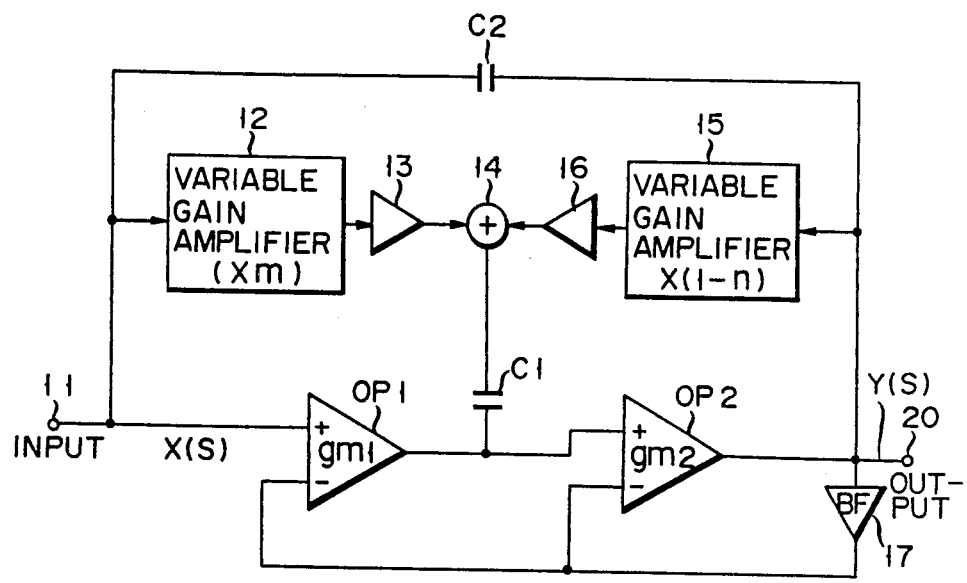
F I G. 8
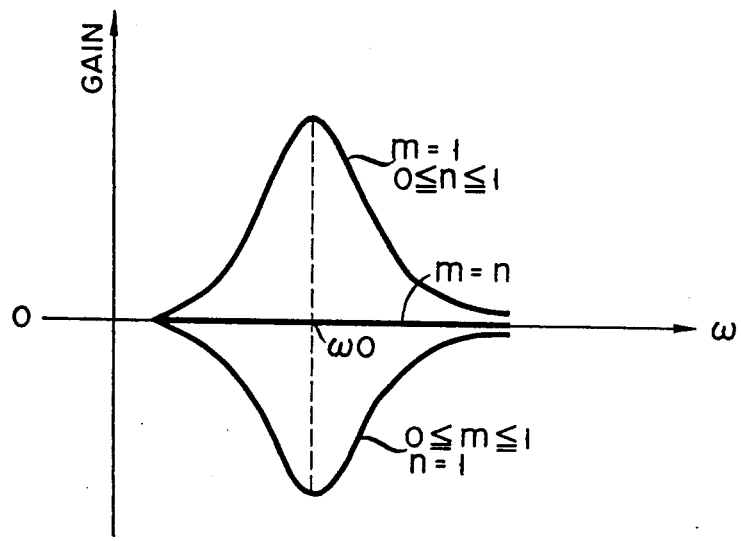
F I G. 9

ACTIVE FILTER TYPE SIGNAL ADJUSTING CIRCUIT

BACKGROUND OF THE INVENTION

1. Field of the Invention

This invention generally relates to an active filter type signal adjusting circuit used to adjust the frequency characteristics of an electric circuit and, more particularly, to an active filter type signal adjusting circuit used for adjusting the image quality of a video signal processing circuit.

2. Description of the Related Art

A conventional frequency characteristics adjusting circuit shown in FIG. 1 is applied to video equipment as an image quality adjusting circuit. This circuit is a so-called active filter type signal adjusting circuit. An input signal is supplied to the first input terminal (+) of first operational amplifier op1 and the second input terminal (−) of third operational amplifier op3. An output from first operational amplifier op1 is supplied to one terminal of first capacitor C1 and the first input terminal (+) of second operational amplifier op2. Note that the other terminal of first capacitor C1 is grounded in an AC manner. An output from second operational amplifier op2 is fed back to the first input terminal (+) of first operational amplifier op1 through second capacitor C2 and is supplied to buffer amplifier BF. An output from buffer amplifier BF appears at an output terminal and is supplied to the second input terminals (−) of first and second operational amplifiers op1 and op2 and the first input terminal (+) of third operational amplifier op3.

In the above circuit, voltage-current conversion coefficient gm3 of third operational amplifier op3 is adjusted, so that gain control having a predetermined angular frequency as a center frequency can be achieved.

Output currents I1, I2, and I3 from operational amplifier op1, op2, and op3 are defined as:

$$I1 = \{X(S) - Y(S)\}gm1$$

$$I2 = \{I1 \times (1/SC1) - Y(S)\}gm2$$

$$I3 = \{Y(S) - X(S)\}gm3$$

wherein gm1, gm2, and gm3 are voltage-current conversion coefficients of operational amplifiers op1, op2, and op3, X(S) (where S is a product of imaginary unit j and angular frequency ω [S=jω]) is an input signal, and Y(S) is an output signal which is given by:

$$Y(S) = X(S) + (I2 + I3) \times 1/SC2$$

When the above equations are arranged about X(S) and Y(S), the following input/output relationship can be obtained:

$$Y = X + [\{(X-Y)(gm1/SC1) - Y\}gm2 + (Y=X)gm3] \times (1/SC2) \tag{1}$$

Therefore, transfer function H(S) of the frequency characteristics (to be referred to as f-characteristics) adjusting circuit is as follows:

$$H(S) = \frac{Y(S)}{X(S)} = \frac{S^2 - \frac{gm3}{C2} \cdot S + \frac{gm1 \cdot gm2}{C1C2}}{S^2 - \frac{gm3 - gm2}{C2} \cdot S + \frac{gm1 \cdot gm2}{C1C2}} \tag{2}$$

Coefficient gm3 is changed to adjust the gain characteristics, so that the f-characteristics adjustment represented by three curves (①, ②, and ③) in FIG. 2 can be realized.

Equation (2) derives gain characteristics G(ω) and group delay characteristics τ(ω), as defined in the following equations (3) and (4):

$$G(\omega) = 10\log\left\{\frac{\left(\frac{gm1 \cdot gm2}{C1C2} - \omega^2\right)^2 + \left(\frac{gm3}{C2}\right)^2 \omega^2}{\left(\frac{gm1 \cdot gm2}{C1C2} - \omega^2\right)^2 + \left(\frac{gm3 - gm2}{C2}\right)^2 \omega^2}\right\}(db) \tag{3}$$

$$\tau(\omega) = \left(\frac{gm1 \cdot gm2}{C1C2} + \omega^2\right)\left\{\frac{\frac{gm3}{C2}}{\left(\frac{gm1 \cdot gm2}{C1C2} - \omega^2\right)^2 + \left(\frac{gm3}{C2}\right)^2 \omega^2} + \frac{\frac{gm2 - gm3}{C2}}{\left(\frac{gm1 \cdot gm2}{C1C2} - \omega^2\right)^2 + \left(\frac{gm2 - gm3}{C2}\right)^2 \omega^2}\right\} \tag{4}$$

In order to realize the gain through characteristics of this circuit which are represented by curve ② in FIG. 2 in an adjusting mode, the following condition must be realized. If G(ω)≡1 in equation (3), the solution for satisfying this condition is as follows:

$$gm3 = (\tfrac{1}{2})gm2 \tag{5}$$

This can easily be realized. Note that the denominator and numerator in equation (2) are conjugate complex numbers under the condition as defined by equation (5). Even if equation (5) is substituted in group delay characteristics equation (4), only the following equation is given:

$$\tau(\omega) = \frac{\frac{gm2}{C2}\left(\frac{gm1 \cdot gm2}{C1C2} + \omega^2\right)}{\left(\frac{gm1 \cdot gm2}{C1C2} - \omega^2\right)^2 + \left(\frac{gm2}{2C2}\right)^2 \omega^2} \tag{6}$$

Therefore, through characteristics τ(ω)≡0 concerning the group delay cannot be realized.

In the conventional f-characteristics adjusting circuit as described above, coefficient gm3 is given by:

$$gm3 = (\tfrac{1}{2})gm2$$

Thus, the following problem is imposed. "Through characteristics can only be realized in gain, and f-characteristics are only realized in group delay."

This problem is caused by achieving the gain through characteristics of the conventional circuit under the condition that the denominator and numerator of the transfer function are conjugate complex numbers.

More specifically, the transfer function including denominator and numerator which are conjugate complex numbers is defined as:

$$H(\omega) = \{f(\omega) + jg(\omega)\}/\{f(\omega) - jg(\omega)\}$$

The gain characteristics thereof are given by:

$$G(\omega) = \sqrt{[\{f(\omega)\}^2 + \{g(\omega)\}^2]/[\{f(\omega)\}^2 + \{-g(\omega)\}^2]}$$
$$= 1$$

Thus, the gain through characteristics can be realized.

Phase characteristics are defined as:

$$\theta(\omega) = \underbrace{\text{Arctan}\{g(\omega)/f(\omega)\}}_{\text{(Phase Component Generated by the Numerator)}} - \underbrace{\text{Arctan}\{-g(\omega)/f(\omega)\}}_{\text{(Phase Component Generated by the Denominator)}}$$

In addition, group delay characteristics obtained by the differential of the phase characteristics by an angular frequency are defined as:

$$\tau(\omega) \equiv -\frac{d\theta(\omega)}{d\omega} \quad (\leftarrow \text{Equation of Group Delay})$$

$$= -\underbrace{\frac{\frac{f(\omega)g'(\omega) - f'(\omega)g(\omega)}{f(\omega)^2}}{1 + \left\{\frac{g(\omega)}{f(\omega)}\right\}^2}}_{\text{(Group Delay Component Generated by the Numerator)}} + \underbrace{\frac{\frac{f(\omega)g'(\omega) - f'(\omega)g(\omega)}{f(\omega)^2}}{1 + \left\{-\frac{g(\omega)}{f(\omega)}\right\}^2}}_{\text{(Group Delay Component Generated by the Denominator)}}$$

$$= -2 \times \frac{f(\omega)g'(\omega) - f'(\omega)g(\omega)}{f(\omega)^2 + g(\omega)^2}$$

wherein f'(ω) and g'(ω) are functions obtained by differentials f(ω) and g(ω) as a function of ω. Therefore, the group delay through characteristics cannot generally be obtained.

As has been described above, the perfect through characteristics of the f-characteristics adjusting circuit cannot be adequately achieved in the circuit shown in FIG. 1 by only the condition that "the denominator and numerator of the transfer function are conjugate complex numbers".

Therefore, an f-characteristics adjusting circuit is required which can realize a transfer function for achieving perfect through characteristics H(S) = 1 as gain characteristics G(ω) ≡ 1 and group delay characteristics τ(ω) ≡ 0 during a "through" operation.

SUMMARY OF THE INVENTION

It is, therefore, an object of the present invention to provide a new and improved active filter type signal adjusting circuit which can realize a transfer function for achieving perfect through characteristics H(S) = 1 [G(ω) ≡ 1, and τ(ω) ≡ 0] in a non-adjusting mode.

According to the present invention, there is provided an active filter type signal adjusting circuit comprising:

input means for inputting a signal to be adjusted;

output means for outputting an adjusted signal;

first operational amplifier means for differentially operating the signal to be adjusted input by the input means and the adjusted signal output by the output means;

second operational amplifier means for differentially operating an output from the first operational amplifier means and the adjusted signal output by the output means;

buffer amplifier means for supplying an output from the second operational amplifier means to the output means as the adjusted signal;

first adding means for obtaining a sum component of a first signal obtained by multiplying a first variable m with the signal to be adjusted input by the input means and a second signal obtained by multiplying a second variable 1−n with the adjusted signal input by the output means;

first capacitor means for superposing the sum component of the first and second signals obtained by the first adding means on the output from the first operational amplifier means to supply a superposed signal to the second operational amplifier means;

second adding means for obtaining as a third signal the signal to be adjusted input by the input means or a component obtained by multiplying the first variable m with the signal to be adjusted; and second capacitor means for superposing the third signal obtained by the second adding means on the output from the second operational amplifier means to supply a superposed signal to the buffer amplifier means, the first and second variables m and 1−n being selected as desired values in an adjusting mode, and being respectively set to m = n = 1 (where 0 ≦ n and m ≦ 1) in a non-adjusting mode.

According to another aspect of the present invention, an active filter type signal adjusting circuit comprises:

a first operational amplifier having a first input terminal which is received an input signal;

a first capacitor having one terminal connected to an output terminal of the first operational amplifier;

a second operational amplifier having a first input terminal connected to the output terminal of the first operational amplifier;

characterized in that the circuit further comprises a first variable gain amplifier for amplifying a signal from the first input terminal of the first operational amplifier to supply the amplified signal to a first buffer amplifier;

a second variable gain amplifier for amplifying an output signal from the second operational amplifier to supply the amplified signal to the second buffer amplifier;

an adder for adding outputs from the first and second buffer amplifiers to supply the sum to the other terminal of the first capacitor;

a second capacitor connected between the first input terminal of the first opeational amplifier or an output terminal of the first variable gain amplifier and an output terminal of the second operational amplifier; and a third buffer amplifier, an input terminal of which is connected to the output terminal of the second operational amplifier, and the output terminal of which is connected to second input terminals of the first and second operational amplifiers.

With the above arrangement, a circuit including the following transfer functions can be realized:

$$H1(\omega) = \frac{m \times S^2 + m \times k \times S + \omega 0^2}{S^2 + n \times k \times S + \omega 0^2}$$

or $$H2(\omega) = \frac{S^2 + m \times k \times S + \omega 0^2}{S^2 + n \times k \times S + \omega 0^2}$$

where k and $\omega 0$ are constants determined in accordance with voltage-current conversion coefficients of the operational amplifiers and capacitors C1 and C2. Therefore, an active filter type signal adjusting circuit for adjusting the signal by variable gains m and $1-n$ of the variable gain amplifier can be realized.

If $m=n=1$, or $m=n$ in the above transfer functions $H1(\omega)$ and $H2(\omega)$, then, (1) $H1(\omega)=1$, $m=n=1$ (2) $H2(\omega)=1$, $n=m$ Therefore, an active filter type signal adjusting circuit having the excellent through characteristics can be realized.

BRIEF DESCRIPTION OF THE DRAWINGS

This and other objects and features of the present invention can be understood through the following embodiments by reference to the accompanying drawings, in which:

FIGS. 3 to 5 are circuit diagrams each explaining the principle of the present invention;

FIG. 6 is a circuit diagram showing an embodiment of the present invention;

FIG. 7 is a graph for explaining characteristics of the circuit shown in FIG. 6;

FIG. 8 is a circuit diagram showing another embodiment of the present invention; and FIG. 9 is a graph for explaining characteristics of the circuit shown in FIG. 8.

DETAILED DESCRIPTION OF THE PREFERRED EMBODIMENTS

Figure 1:
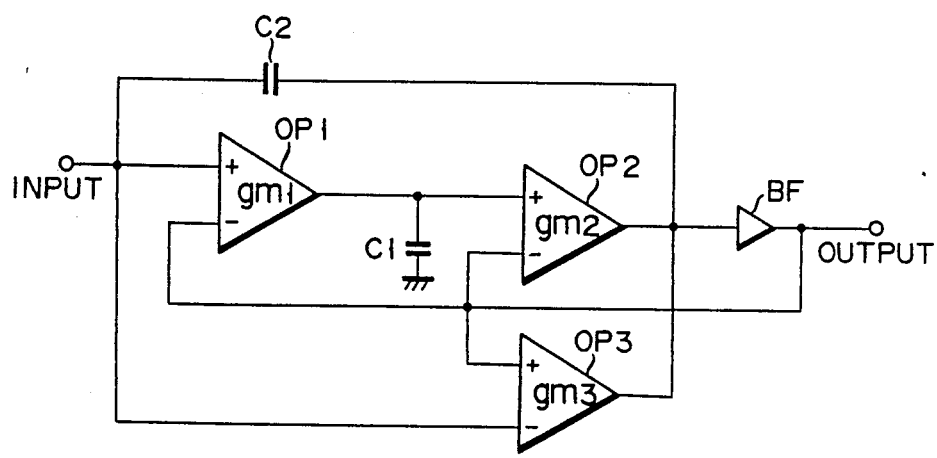
FIG. 1 is a circuit diagram showing an active filter type signal adjusting circuit used as a conventional image quality adjusting circuit.
Figure 2:
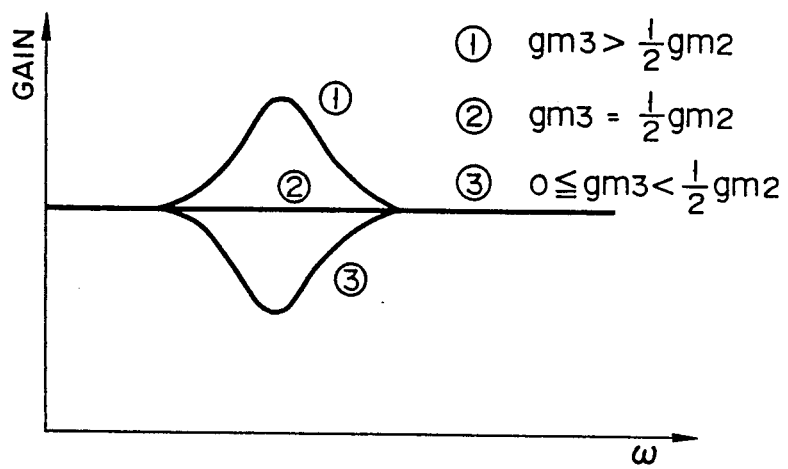
FIG. 2 is a graph for explaining characteristics of the circuit shown in FIG. 1.

Transfer functions used in the present invention will be described below before a circuit arrangement according to embodiments of the present invention is described.

In order to solve the problems described above, one of the following two types of transfer function is applied to an active filter type signal adjusting circuit of the present invention:

$$H1(S) = \frac{MS^2 + M \times K \times S + \omega 0^2}{S^2 + N \times K \times S + \omega 0^2} \quad (7)$$

$$H2(S) = \frac{S^2 + M \times K \times S + \omega 0^2}{S^2 + N \times K \times S + \omega 0^2} \quad (8)$$

wherein K and $\omega 0$ are constants determined in accordance with voltage-current conversion coefficients (gm1, gm2) of operational amplifiers and capacitors C1 and C2. Characteristics of the active filter type signal adjusting circuit are adjusted by variables M and N.

If $M=N=1$, or $M=N$ in the above functions $H1(S)$ and $H(2)$, through characteristics in a non-adjusting mode can be obtained. Therefore, in both $H1(S)$ and $H2(S)$, since transfer functions themselves are respectively set to be "1", perfect through characteristics (including gain and group delay characteristics) as an object of this invention can be obtained.

The transfer functions derived from equations (7) and (8) will be described below on the basis of a general secondary active filter circuit shown in FIG. 3.

Referring to FIG. 3, reference symbols gm1 and gm2 respectively denote voltage-current conversion coefficients of operational amplifiers op1 and op2, and V1 to Vm and V1' to Vn' either denote signals obtained by some calculations of input X and output Y shown in FIG. 3, or AC ground signals.

An equation for a current component is as follows:

$$gm1(X - Y) = \frac{Z - V1}{\frac{1}{SC1}} + \frac{Z - V2}{\frac{1}{SC2}} + \ldots + \frac{Z - Vm}{\frac{1}{SCm}}$$
$$= S(C1 + C2 + \ldots + Cm)Z - S(C1V1 + C2V2 + \ldots + CmVm)$$

where, in when Z is an output terminal signal from operational amplifier op1, then, $$Z = \frac{C1V1 + C2V2 + \ldots + CmVm}{C1 + C2 + \ldots + Cm} + \frac{gm1}{S(C1 + C2 + \ldots + Cm)}(X - Y)$$

Similarly, a current equation of an output terminal of operational amplifier op2 derives:

$$Y = \frac{C1'V1' + C2'V2' + \ldots + Cn'Vn'}{C1' + C2' + \ldots + Cn'} + \frac{gm2}{S(C1' + C2' + \ldots + Cn')}(Z - Y)$$

In addition, substituting this equation for the equation of Z yields the following equation:

$$Y = V0' + \frac{gm2}{S(C1' + C2' + \ldots + Cn')} \left\{ (V0 - Y) + \frac{gm1}{S(C1 + C2 + \ldots + Cm)}(X - Y) \right\} \quad (9)$$

for $$V0 = \frac{C1V1 + C2V2 + \ldots + CmVm}{C1 + C2 + \ldots + Cm}$$

$$V0' = \frac{C1'V1' + C2'V2' + \ldots + Cn'Vn'}{c1' + C2' + \ldots + Cn'}$$

If $Y/X=H1(S)$, or $Y/X=H2(S)$, equations (7) and (8) are modified as follows: Thus, $$Y = MX + (K/S)\{(MX - NY) + \omega 0^2/SK(X - Y)\} \quad (10A)$$

or $$Y = X + (K/S)\{(MX - NY) + \omega_0^2/SK(X - Y)\} \quad (10B)$$

Therefore, by comparing equation (9) with equation (10A), or (9) with (10B), the following equations can be obtained:

$$\begin{cases} VO' = MX \\ VO = MX + (1 - N)Y \end{cases}$$

or $$\begin{cases} VO' = X \\ VO = MX + (1 - N)Y \end{cases}$$

As a result, transfer functions (7) and (8) can be realized.

It should be noted that the circuit shown in FIG. 3 can be realized as two types of simplest circuit, as shown in FIGS. 4 and 5. Referring to FIGS. 4 and 5, K1 and K2 respectively correspond to M and 1−N.

Embodiments of the present invention based on the above principle will be described below with reference to the accompanying drawings.

FIG. 6 shows an embodiment of the present invention. An input signal serving as, e.g., a video signal, is supplied to input terminal 11. This signal is supplied to a first input terminal (+) of first operational amplifier op1 having voltage-current conversion coefficient gm1 and first variable gain amplifier 12 of ×m (m times). An output terminal of first operational amplifier op1 is connected to one terminal of first capacitor C1 and a first input terminal (+) of second operational amplifier op2 having voltage-current conversion coefficient gm2. An output terminal of second operational amplifier op2 is connected to output unit 20. In addition, second capacitor C2 is connected between the output terminal of second operational amplifier op2 and an output terminal of first variable gain amplifier 12. An output from second operational amplifier op2 is also supplied to second variable gain amplifier 15 of ×(1−n) ((1−n) times). Outputs from first and second variable gain amplifiers 12 and 15 are supplied to adder 14 through buffer amplifiers 13 and 16, respectively. An output from adder 14 is supplied to the other terminal of first capacitor C1.

Furthermore, the output from second operational amplifier op2 is fed back to a second input terminals (−) of first and second operational amplifiers op1 and op2 through third buffer amplifier 17.

An input/output relationship in the above circuit is defined as:

$$Y = mX + \{(X - Y)(gm1/SC1) + mX + (1 - n)Y - Y\}(gm2/SC2) \quad (11)$$

wherein X(S) is an input signal and Y(S) is an output signal. Therefore, transfer function H1(S) can be obtained as follows:

$$H1(S) = \frac{mS^2 + m \cdot \frac{gm2}{C2} \cdot S + \frac{gm1 \cdot gm2}{C1C2}}{S^2 + n \cdot \frac{gm2}{C2} \cdot S + \frac{gm1 \cdot gm2}{C1C2}} \quad (12)$$

for $0 \leq n$, and $m \leq 1$. If m=n=1 in H1(S) in a non-adjusting mode, the following equation is obtained:

$$H1(S)m=n=1\equiv1 \quad (13)$$

Therefore, perfect through characteristics can be realized. Image quality, i.e., f-characteristics, adjustment can be achieved by varying gains m and n.

(a) In an emphasis mode, m is fixed to be "1" and n is changed to adjust the f-characteristics.

$$\left.\begin{array}{ll} m = 1 & \text{fixed} \\ 0 \leq n \leq 1 & \text{variable} \end{array}\right\} \quad (14)$$

(b) In a suppression mode, n is fixed to be "1" and m is changed to adjust the f-characteristics.

$$\left.\begin{array}{ll} 0 \leq m \leq 1 & \text{variable} \\ n = 1 & \text{fixed} \end{array}\right\} \quad (15)$$

Gain characteristics obtained under the above conditions are shown in FIG. 7.

The present invention is not limited to the above embodiment and can be arranged as shown in FIG. 8. According to a first embodiment, one terminal of capacitor C2 is connected to an output unit of first variable amplifier 12. However, the terminal can be directly connected to input terminal 11. Since the other parts in FIG. 8 are the same as those in the embodiment shown in FIG. 6, the same reference numerals as in FIG. 8 denote the same parts in FIG. 6, and a description thereof is omitted. An input/output relationship of this circuit is given by:

$$Y = X + \{(X - Y) \cdot (gm1/SC1) + mX + (1 - n)Y\} \cdot (gm3/SC2) \quad (16)$$

Therefore, the transfer function H2(S) can be obtained:

$$H2(S) = \frac{S^2 + m \frac{gm2}{C2} \cdot S + \frac{gm1 \cdot gm2}{C1C2}}{S^2 + n \cdot \frac{gm2}{C2} \cdot S + \frac{gm1 \cdot gm2}{C1C2}} \quad (17)$$

If m=n in H2(S), perfect through characteristics can be realized as follows:

$$H2(S)m=n=1 \quad (18)$$

for $0 \leq m$, and $n \leq 1$.

Image quality adjustment at this time is performed by varying gains m and n.

(a) In an emphasis mode, m is fixed to be "1" and n is changed to adjust the image quality.

$$\left.\begin{array}{ll} m = 1 & \text{fixed} \\ 0 \leq n \leq 1 & \text{variable} \end{array}\right. \quad (19)$$

(b) In a suppression mode, n is fixed to be "1" and m is changed.

$$\left.\begin{array}{ll} 0 \leq m \leq 1 & \text{variable} \\ n = 1 & \text{fixed} \end{array}\right. \quad (20)$$

Gain characteristics at this time are shown in FIG. 9.

According to the present invention as described above, gains m and n of the variable gain amplifier in a non-adjusting mode are set as follows: m=n=1 in the first embodiment and m=n in the second embodiment. Therefore, transfer functions themselves can be set to be "1", thus obtaining an active filter type signal adjusting circuit having perfect through characteristics including not only gain characteristics but also phase and group delay characteristics.

What is claimed is:

1. An active filter type signal adjusting circuit comprising:
   input means for inputting a signal to be adjusted;
   output means for outputting an adjusted signal;
   first operational amplifier means for differentially operating the signal to be adjusted input by said input means and the adjusted signal output by said output means;
   second operational amplifier means for differentially operating an output from said first operational amplifier means and the adjusted signal output by said output means;
   buffer amplifier means for supplying an output from said second operational amplifier means to said output means as the adjusted signal;
   first adding means for obtaining a sum component of a first signal obtained by multiplying a first variable m with the signal to be adjusted input by said input means and a second signal obtained by multiplying a second variable 1−n with the adjusted signal output by said output means;
   first capacitor means for superposing the sum component of the first and second signals obtained by said first adding means on the output from said first operational amplifier means to supply a superposed signal to said second operational amplifier means;
   second adding means for obtaining as a third signal, the signal to be adjusted input by said input means or a component obtained by multiplying the first variable m with the signal to be adjusted; and
   second capacitor means for superposing the third signal obtained by said second adding means on the output from said second operational amplifier means to supply a superposed signal to said buffer amplifier means,
   the first and second variables being selected as desirable values m and 1−n in an adjusting mode, and being respectively set to m=n=1 (where 0≦n and m=1) in a non-adjusting mode.

2. A circuit according to claim 1, wherein said first adding means comprises a first variable gain amplifier for multiplying m serving as the first variable with the signal to be adjusted input by said input means to output the first signal, a second variable gain amplifier for multiplying (1−n) serving as the second variable with the adjusted signal output by said output means to output the second signal, and an adder for adding the first and second signals output by said first and second variable gain amplifiers.

3. A circuit according to claim 2, wherein the first and second signals output by said first and second variable gain amplifiers are supplied to said adder through corresponding buffer circuits.

4. A circuit according to claim 1, wherein said second adding means includes a variable gain amplifier for multiplying m serving as the first variable with the signal to be adjusted input by said input means to output the third signal.

5. A circuit according to claim 2, wherein an output from said first variable gain amplifier is commonly used as the first signal obtained by said first adding means and the third signal obtained by said second adding means.

6. A circuit according to claim 1, wherein said second adding means directly transfers the signal to be adjusted input by said input means as the third signal.

7. An active filter type signal adjusting circuit comprising:
   input means for inputting a signal to be adjusted;
   output means for outputting an adjusted signal;
   first operational amplifier means for differentially operating the signal to be adjusted input by said input means and the adjusted signal output by said output means;
   second operational amplifier means for differentially operating an output from said first operational amplifier means and the adjusted signal output by said output means;
   buffer amplifier means for supplying an output from said second operational amplifier means to said output means as the adjusted signal;
   first and second adding means each for obtaining a first signal obtained by multiplying a first variable m with the signal to be adjusted input by said input means and a second signal obtained by multiplying a second variable 1−n with the adjusted signal output by said output means;
   first and second capacitor means for superposing the first and second signals obtained by said first and second adding means on the output from said first operational amplifier means to supply a superposed signal to said second operational amplifier means;
   third adding means for obtaining, as a third signal, the signal to be adjusted input by said input means or a component obtained by multiplying the first variable m with the signal to be adjusted; and
   third capacitor means for superposing the third signal obtained by said third adding means on the output from said second operational amplifier means to supply a superposed signal to said buffer amplifier means,
   the first and second variables m and 1−n being selected as desirable values in an adjusting mode and being respectively set to m=n (where 0≦m and n≦1) in a non-adjusting mode.

8. A circuit according to claim 7, wherein said first adding means comprising a first variable gain amplifier for multiplying m serving as the first variable with the signal to be adjusted input by said input means to output the first signal, and said second adding means comprises a second variable gain amplifier for multiplying (1−n) serving as the second variable with the adjusted signal output by said output means to output the second signal.

9. A circuit according to claim 7, wherein said third adding means comprises a variable gain amplifier for multiplying m serving as the first variable with the signal to be adjusted input by said input means to output the third signal.

10. A circuit according to claim 8, wherein an output from said first variable gain amplifier is commonly used as the first signal obtained by said first adding means and the third signal obtained by said third adding means.

11. A circuit according to claim 7, wherein said third adding means directly transfers the signal to be adjusted input by said input means as the third signal.

* * * * *